United States Patent
Zhao et al.

(10) Patent No.: US 12,537,484 B2
(45) Date of Patent: Jan. 27, 2026

(54) RF AMPLIFIER AND ELECTRONIC DEVICE COMPRISING THE SAME

(71) Applicant: Ampleon Netherlands B.V., Nijmegen (NL)

(72) Inventors: Junlei Zhao, Nijmegen (NL); Mohadig Widha Rousstia, Nijmegen (NL); Radjindrepersad Gajadharsing, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 452 days.

(21) Appl. No.: 18/179,118

(22) Filed: Mar. 6, 2023

(65) Prior Publication Data

US 2023/0283240 A1 Sep. 7, 2023

(30) Foreign Application Priority Data

Mar. 7, 2022 (NL) .................................... 2031173

(51) Int. Cl.
  *H03F 1/02* (2006.01)
  *H03F 3/21* (2006.01)
(52) U.S. Cl.
  CPC .......... *H03F 1/0288* (2013.01); *H03F 3/211* (2013.01); *H03F 2200/451* (2013.01); *H03F 2203/21142* (2013.01)
(58) Field of Classification Search
  CPC .. H03F 1/0288; H03F 3/211; H03F 2200/451; H03F 2203/21142

(Continued)

(56) References Cited

U.S. PATENT DOCUMENTS

2011/0175677 A1    7/2011  Jeong et al.
2012/0025915 A1*   2/2012  Ui ........................... H03F 3/189
                                                              330/124 R (Continued)

FOREIGN PATENT DOCUMENTS

WO    WO-2005088830 A1 *  9/2005   ........... H03F 1/0288

OTHER PUBLICATIONS

International Type Report on Novelty Research, Application No. NL 2031173, dated Oct. 17, 2022, 9 pages.

(Continued)

*Primary Examiner* — Hafizur Rahman
(74) *Attorney, Agent, or Firm* — McDonnell Boehnen Hulbert & Berghoff LLP

(57) ABSTRACT

Example embodiments relate to radiofrequency, RF, amplifiers and electronic devices that include RF amplifiers. One example RF amplifier includes a splitter configured to split an RF input signal received at an input of the RF amplifier into a plurality of RF signal parts. The RF amplifier also includes a plurality of Doherty amplifiers, each Doherty amplifier having a main amplifier and a peak amplifier. Each Doherty amplifier is configured to amplify a respective RF signal part and output a respective amplified RF signal part. Additionally, the RF amplifier includes a combiner. The combiner is configured to combine the amplified RF signal parts from the plurality of Doherty amplifiers into an RF output signal and output the RE output signal. The combiner includes a plurality of inputs and an output. Each input of the combiner is connected to an output of a respective Doherty amplifier among the plurality of Doherty amplifiers.

20 Claims, 8 Drawing Sheets

(58) Field of Classification Search
USPC .......................................................... 330/295
See application file for complete search history.

(56) References Cited

U.S. PATENT DOCUMENTS

2020/0083848 A1* 3/2020 Zhou .................... H03F 3/3001
2020/0295714 A1* 9/2020 Qureshi ................. H03F 3/245

OTHER PUBLICATIONS

Pashaeifar, Masoud, Leo CN De Vreede, and Morteza S. Alavi. "14.4 A 24-to-30GHz double-quadrature direct-upconversion transmitter with mutual-coupling-resilient series-Doherty balanced PA for 5G MIMO arrays." In 2021 IEEE International Solid-State Circuits Conference (ISSCC), vol. 64, pp. 223-225. IEEE, 2021.

* cited by examiner

RF AMPLIFIER AND ELECTRONIC DEVICE COMPRISING THE SAME

CROSS-REFERENCE TO RELATED APPLICATIONS

The present application is a non-provisional patent application claiming priority to Netherlands Patent Application No. NL 2031173, filed Mar. 7, 2022, the contents of which are hereby incorporated by reference.

FIELD OF THE DISCLOSURE

The present disclosure relates to a radiofrequency, RF, amplifier and to an electronic device that includes the same. Such amplifiers and devices can, for example, be used in base stations for mobile telecommunications, such as in 4G or 5G systems, and in solid-state cooking apparatuses.

BACKGROUND

RF amplifiers are often used in environments in which the impedance that is presented to the RF amplifier deviates over time. For example, in solid-state cooking apparatuses, the impedance seen by the RF amplifier may depend on the type and quantity of foodstuff that is prepared in the cooking cavity. Similarly, the impedance seen by an amplifier used in a base station may depend on weather conditions and unwanted reflections. Despite these changing impedance levels, the RF amplifier is required to remain functional while offering acceptable efficiency, output power, linearity, and gain values.

SUMMARY

In the paper "14.4 A 24-to-30 GHz Double-Quadrature Direct-Upconversion Transmitter with Mutual-Coupling-Resilient Series-Doherty Balanced PA for 5G MIMO Arrays", by M. Pashaeifar, L. C. N. de Vreede and M. S. Alavi, 2021 IEEE International Solid-State Circuits Conference (ISSCC), 2021, pp. 223-225, an RF amplifier is disclosed that includes a splitter for splitting an RF input signal received at an input of the RF amplifier into two RF signal parts. The RF amplifier further includes two Doherty amplifiers, each Doherty amplifier having a main amplifier and a peak amplifier. Each Doherty amplifier is configured for amplifying a respective RF signal part and to output a respective amplified RF signal part at an output of the Doherty amplifier. A combiner is used for combining the amplified RF signal parts from the two Doherty amplifiers into an RF output signal and to output the RF output signal at an output of the RF amplifier. To this end, the combiner includes a quadrature hybrid coupler of which the RF signal part from one Doherty amplifier received at one port of the coupler is coupled to the output port of the coupler, and of which the RF signal part from the other Doherty amplifier is coupled to the output port albeit with a phase offset of 90 degrees relative to the other RF signal part. The remaining port of the coupler is connected to a termination load, such as a 50 Ohm resistor connected to ground.

The splitter may also include a quadrature hybrid coupler such that the amplified RF signal parts are in-phase at the output of the RF amplifier.

The phase offset introduced by the quadrature hybrid coupler mitigates the effect of the impedance mismatch at the output of the RF amplifier when compared to a single Doherty amplifier having a power capability equal to the sum of the power capabilities of the abovementioned two Doherty amplifiers.

Despite these improvements, the quadrature hybrid coupler requires considerable area and increases the insertion loss thereby degrading efficiency and maximum output power of the RF amplifier.

The present disclosure provides an amplifier in which the abovementioned problems do not occur or at least to a lesser extent.

The present disclosure provides the RF amplifier as defined in claim 1, which is characterized in that, for a pair of Doherty amplifiers among the plurality of Doherty amplifiers, a difference between a) a phase delay from an output of the main amplifier of one Doherty amplifier of the pair of Doherty amplifiers to the output of the one Doherty amplifier, and b) a phase delay from an output of the main amplifier of the other Doherty amplifier of the pair of Doherty amplifiers to the output of the other Doherty amplifier equals $(n+m) \times 180/p + q \times 180$ degrees at an operational frequency, wherein $p$ is the number of Doherty amplifiers, $n$ an integer ranging from 0 to $(p-2)$, $q$ an integer, and $m$ having a value between 0.8 and 1.2, such as between 0.9 and 1.1 (e.g., 1).

As disclosed herein, by using Doherty amplifiers that have a different phase relationship between the output of the main amplifier and the output of the Doherty amplifier, it becomes possible to omit the hybrid coupler as the required phase offset is realized by using different Doherty amplifiers.

The phase delay from the output of the main amplifier of a Doherty amplifier among the Doherty amplifiers to the output of the Doherty amplifier can be different for each Doherty amplifier among the Doherty amplifiers. Furthermore, the phase difference can equal $(n+m) \times 180/p + q \times 180$ degrees at the operational frequency for each pair of Doherty amplifiers among the plurality of Doherty amplifiers.

Each Doherty amplifier among the plurality of Doherty amplifiers may include a Doherty splitter for splitting the received RF signal part into a main RF signal part and a peak RF signal part, wherein the main amplifier is configured for amplifying the main RF signal part and for outputting an amplified main RF signal part, and wherein the peak amplifier is configured for amplifying the peak RF signal part and for outputting an amplified peak RF signal part. Each Doherty amplifier may further include a Doherty combiner for combining the amplified main RF signal part and the amplified peak RF signal part into a respective amplified RF signal part and to output the respective amplified RF signal part at the output of the Doherty amplifier.

The Doherty combiner of each of the plurality of Doherty amplifiers may be configured to combine the amplified main RF signal part and the amplified peak RF signal part at a combining node of that Doherty amplifier. The combining node can be directly connected to and/or form the output of that Doherty amplifier. Alternatively, the combining node may be connected to the output of that Doherty amplifier through a first impedance inverter.

The first impedance inverter of at least one Doherty amplifier among the plurality of Doherty amplifiers can be formed by a first quarter wavelength transmission line, or by an electrical equivalent of this first quarter wavelength transmission line. Typically, the characteristic impedance is different from the impedance seen looking into the combiner when the RF amplifier is connected to a nominal load. For example, the nominal load may correspond to 50 Ohm and the characteristic impedance may be different from 50 Ohm for the purpose of providing an impedance between the impedance seen at the input of the combiner, which is typically 50 Ohm, and the impedance to be presented at the output of the Doherty amplifier to which the impedance inverter is connected.

The Doherty amplifier of each of the plurality of Doherty amplifiers may include a main branch extending between the output of the main amplifier and the combining node, and a peak branch extending between the output of the peak amplifier and the combining node. The main branch can be configured to transform an impedance seen at the output of the Doherty amplifier to a first impedance seen at the output of the main amplifier when the peak amplifier is off, and to transform the impedance seen from the main branch at the output of the Doherty amplifier to a second impedance seen at the output of the main amplifier when the peak and main amplifier are in saturation, wherein the second impedance is lower than the first impedance. The peak branch can be configured to present a high impedance at the combining node when looking into the peak branch when the peak amplifier is off, and to transform the impedance seen from the peak branch at the output of the Doherty amplifier to a third impedance seen at the output of the peak amplifier when the peak and main amplifier are in saturation.

At least one of the main branch and peak branch may include a second impedance inverter for each Doherty amplifier among the plurality of Doherty amplifiers. The second impedance inverter(s) can be formed by a second quarter wavelength transmission line or by an electrical equivalent of the second quarter wavelength transmission line.

During operation and at the operational frequency of the RF amplifier, an impedance seen at an output of a Doherty amplifier among the plurality of Doherty amplifiers when looking away from that Doherty amplifier can be substantially identical for each of the plurality of Doherty amplifiers.

The combiner can be an in-phase combiner, wherein the phase delays between each of the inputs of the combiner and the output of the combiner are substantial identical. Furthermore, the combiner can be an isolated combiner, such as a Wilkinson combiner. By using an isolated combiner, each Doherty amplifier may not be (or may insignificantly be) loaded by other Doherty amplifiers.

Each Doherty amplifier of the plurality of Doherty amplifiers may have a configuration similar to one of a regular Doherty amplifier configuration, an inverted Doherty amplifier configuration, a parallel Doherty amplifier configuration, an integrated Doherty amplifier configuration, a Doherty amplifier configuration having a transformed-based Doherty combiner, or a Doherty amplifier configuration having a coupled lines-based Doherty combiner. The configuration of at least two Doherty amplifiers among the plurality of Doherty amplifiers can be different. In an embodiment, each Doherty amplifier among the plurality of Doherty amplifiers can have a different configuration.

The splitter may include an input for receiving the input RF signal from the input of the RF amplifier, and a plurality of outputs for outputting the plurality of RF signal parts corresponding to the plurality of Doherty amplifiers. The splitter may further include one or more phase delay elements for imparting a phase delay to one or more of the plurality of RF signal parts to cause the amplified RF signal parts to add up in-phase at the output of the RF amplifier.

The RF amplifier may further include a substrate, such as a printed circuit board. The main amplifier and peak amplifier may each include a semiconductor die that is arranged on the substrate, on which semiconductor die a power transistor is integrated. The power transistor can, for example, be one of a silicon laterally diffused metal-oxide-semiconductor transistor and a Gallium Nitride-based field-effect transistor.

The semiconductor die of the main amplifier and peak amplifier can be packaged, optionally in a single package. In embodiments, the power transistor forming the main amplifier and the power transistor forming the peak amplifier can be arranged in different semiconductor dies or on a single die. The package of the main amplifier and package of the peak amplifier can be mounted on the substrate.

When the main amplifier and peak amplifier include a power transistor, the output of the main amplifier may correspond to an intrinsic drain of the power transistor of the main amplifier, and the output of the peak amplifier may correspond to an intrinsic drain of the power transistor of the peak amplifier.

At least one Doherty amplifier among the plurality of Doherty amplifiers may include a multi-way Doherty amplifier including two or more peak amplifiers.

Although embodiments described herein may include two Doherty amplifiers, the present disclosure particularly relates to embodiments in which three or four Doherty amplifiers. Embodiments in which five or more Doherty amplifiers are used are not excluded.

According to a further aspect, the present disclosure provides an electronic device that includes the RF amplifier as described above. The electronic device can be a base station for mobile telecommunications, or a solid-state cooking apparatus.

BRIEF DESCRIPTION OF THE DRAWINGS

Next, example embodiments will be described in more detail referring to the appended drawings.

DETAILED DESCRIPTION

Figure 1:
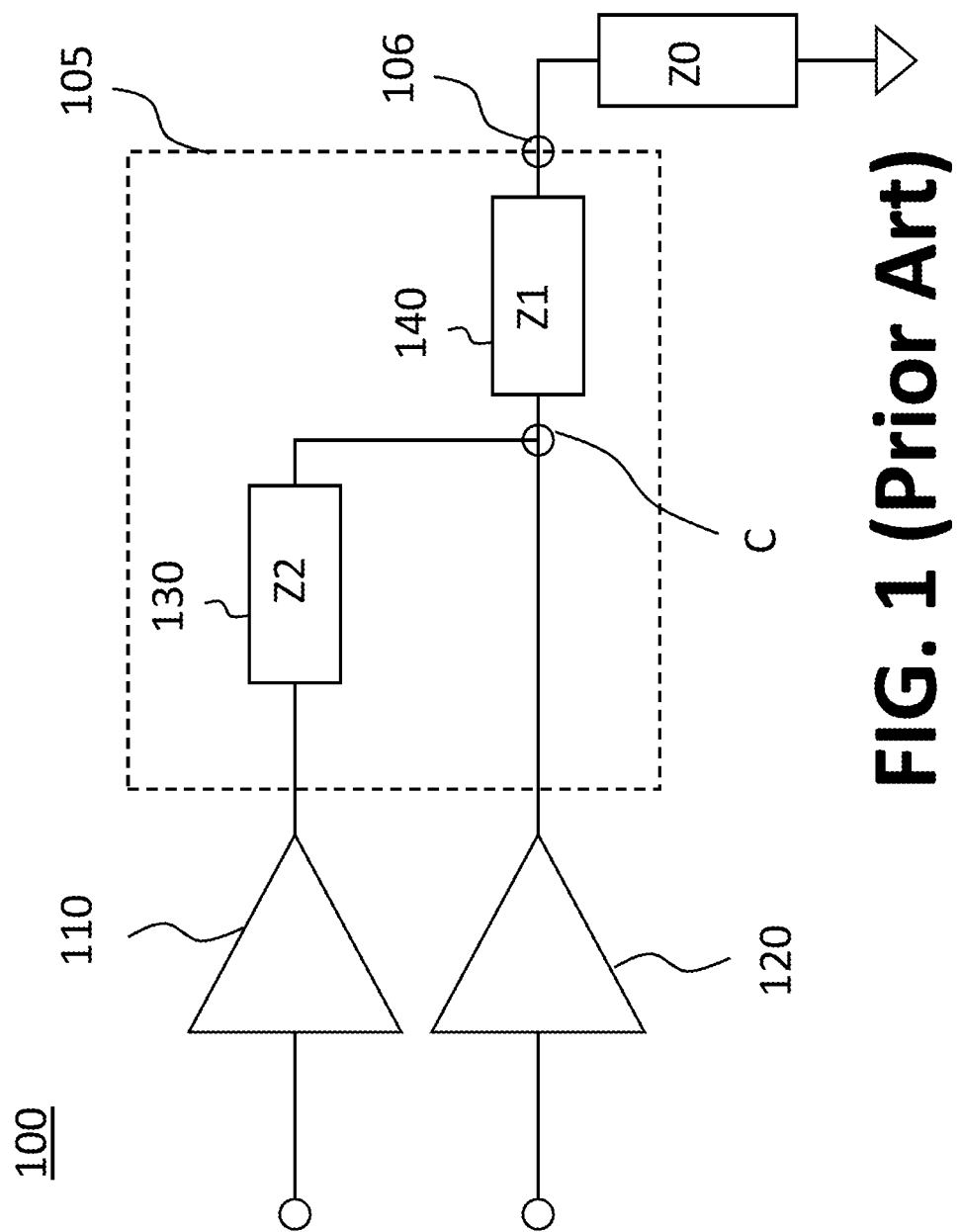
FIG. 1 illustrates a Doherty amplifier.

FIG. 1 illustrates a Doherty amplifier 100. This amplifier includes a main amplifier 110 and a peak amplifier 120. Signals simplified by main amplifier 110 and peak amplifier 120 are combined at combining node C. An impedance inverter 130 is arranged in between combining node C and the output of main amplifier 110. Impedance inverter 130 is generally realized using a quarter wavelength transmission line with a given characteristic impedance Z2. Combining node C is connected to a load Z0 through another impedance inverter 140 that has a characteristic impedance Z1.

It should be noted that impedance inverters 130, 140 can equally be realized using lumped equivalent circuits thereof. For example, at the operational frequency, a L-C-L or C-L-C network can be constructed that has similar behavior as the transmission line.

Figure 2:
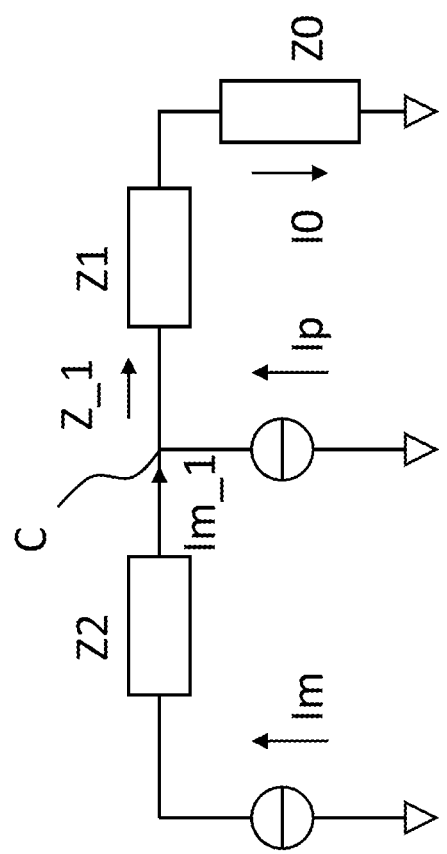
FIG. 2 illustrates an electric circuit diagram for explaining the operation of the Doherty amplifier of FIG. 1.

The operation of the Doherty amplifier will be explained referring to FIG. 2. In FIG. 2, main amplifier 110 is represented by a current source outputting a current Im and peak amplifier 120 is represented by a current source outputting a current Ip. Main amplifier 110 and peak amplifier 120 are assumed to have equal power capability, and therefore Ip=Im. Such a Doherty amplifier is referred to as a symmetric Doherty amplifier.

Main amplifier 110 is generally biased in class AB or class B, whereas peak amplifier 120 is biased in class C. Consequently, at low input powers, only main amplifier 110 is operational, and at high input powers, both main amplifier 110 and peak amplifier 120 are operational.

The impedance Z_1 seen at combining node C looking towards impedance inverter 140 can be computed using Z_1=Z1*Z1/Z0. At high power levels, both Im and Ip pass through combining node C towards load Z0. The voltage at combining node C will therefore be equal to Vc=(Im_1+Ip) Z1*Z1/Z0. The impedance seen by peak amplifier 120 will therefore be Vc/Ip=(Im_1/Ip+1)Z1*Z1/Z0. Assuming that both main amplifier 110 and peak amplifier 120 should be presented with 50 Ohm to output their maximum power, and that load Z0 also equals 50 Ohm, this reduces to Vc/Ip=50=2Z1*Z1/50, yielding Z1=50/sqrt(2). Therefore, the impedance seen at combining node C equals 25 Ohm.

Under low power conditions, the impedance seen by main amplifier 110 equals Z2*Z2/25 as the impedance at combining node C looking towards peak amplifier 120 is very high. Assuming that an impedance of 2Z0 should be presented to main amplifier 110 under low power conditions for the purpose of obtaining good efficiencies, Z2 can be calculated using 2Z0=100=Z2*Z2/25, yielding Z2=50 Ohm. It is noted that under high power conditions, the impedance presented at the output of impedance inverter 130 equals 50 Ohm. This same impedance will therefore be presented at the output of main amplifier 110.

Within the context of the present disclosure, impedance inverters 130, 140 are part of Doherty combiner 105, and the output of impedance inverter 140 forms the output of Doherty amplifier 100. In FIG. 2, Doherty combiner 105 is indicated using a dashed rectangle and the output of Doherty amplifier 100 is indicated using circle 106. It is further noted that Doherty amplifier 100 also includes a Doherty splitter, which is omitted in FIG. 1.

Doherty amplifiers can be realized using different configurations. The configuration shown in FIG. 1, in which a quarter wave transmission line is arranged in between main amplifier 110 and combining node C, is referred to as the regular Doherty configuration.

Figure 3:
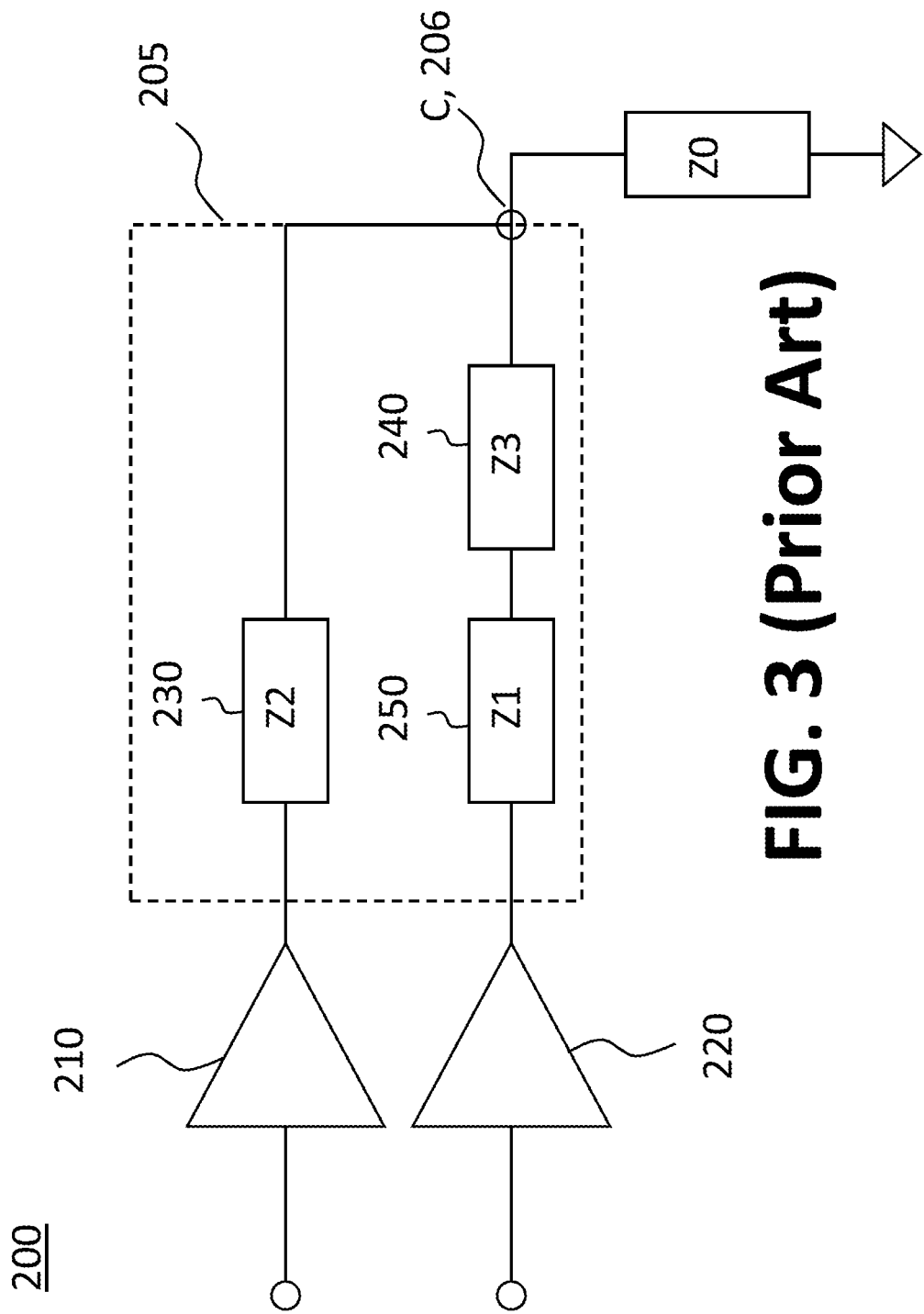
FIG. 3 illustrates a Doherty amplifier.

FIG. 3 illustrates a different configuration of a Doherty amplifier 200. This configuration is generally referred to as a parallel Doherty configuration.

Compared to Doherty amplifier 100, impedance inverter 140 is now absorbed into Doherty combiner 205. In this case, and assuming the same desired impedance levels for load Z0, main amplifier 210, and peak amplifier 220, impedance inverter 230 must have a characteristic impedance of sqrt(2)*50 Ohm for transforming the 50 Ohm at combining node C to 100 Ohm at the output of main amplifier 210 under low power conditions. Under these conditions, the output impedance of peak amplifier 220, which is very high, is transformed by impedance inverter 250 to a low value, which in turn is transformed into a high value by impedance inverter 240. Assuming main amplifier 210 and peak amplifier 220 deliver equal amounts of current to load Z0 under high power conditions, it can be assumed that the impedance seen at the output of impedance inverter 240 equals 100 Ohm. This value is transformed by impedance inverter 240 to 50 Ohm. To that end, impedance inverter 240 has a characteristic impedance of 50*sqrt(2). Impedance inverter 250 has a characteristic impedance of 50 Ohm to ensure that under high power conditions, the impedance of 50 Ohm, obtained by impedance inverter 240, is presented at the output of peak amplifier 220.

In the above, main amplifier 110, 210 and peak amplifier 120, 220 were assumed to be more or less ideal amplifiers. In practice, main amplifier 110, 210 and peak amplifier 120, 220 are formed using power transistors such as silicon based laterally diffused metal-oxide-semiconductor transistors or Gallium Nitride based field-effect transistors. Large periphery devices generally have low output impedances. These are matched to higher impedances, e.g. 50 Ohm, using impedance matching networks. Typically, the transistors are mounted on a printed circuit board directly or using a package in which the transistors are arranged, wherein the package is mounted on the printed circuit board. The above-mentioned impedance matching networks can be distributed over the printed circuit board and the package and/or die in or on which the transistors are arranged.

For large periphery devices, the impedance in the off state of the peak transistor may be closer to an RF short than to an RF open. This complicates the manner in which an RF open should be realized when the peak amplifier is switched off during low power conditions. Furthermore, the impedance matching networks have an impact on the overall impedance matching of the RF amplifier.

Figure 4:
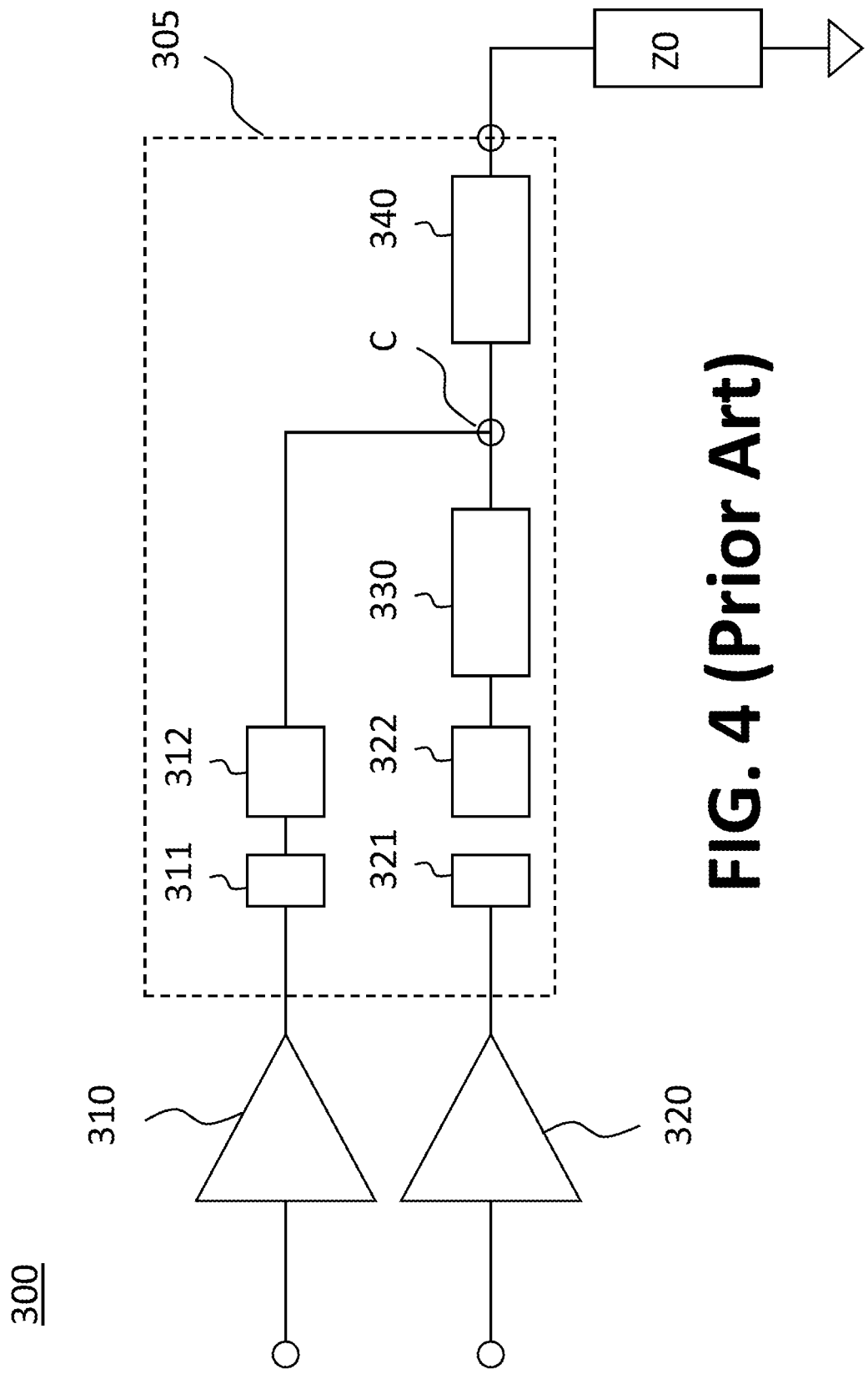
FIG. 4 illustrates a Doherty amplifier.

FIG. 4 illustrates a configuration that addresses at least some difficulties associated with non-ideal amplifiers. In FIG. 4, a Doherty amplifier 300 is shown in which main amplifier 310 and peak amplifier 320 each correspond to a power transistor. These transistors are connected to impedance matching networks 311, 321, which in turn are connected to offset lines 312, 322. In between combining node C and offset line 322, an impedance inverter 330 is arranged. In addition, an impedance inverter 340 is arranged in between combining node C and load Z0.

Because an impedance inverter is now arranged in between peak amplifier 320 and combining node C, instead of in between main amplifier 310 and combining node C, this configuration is referred to as an inverted Doherty amplifier.

Impedance matching network 311 and offset line 312 are configured to transform the relatively low impedance at the output of the power transistor to the impedance seen at combining node C. This impedance transformation ratio needs to be different for low and high-power conditions. In fact, impedance matching network 311 and offset line 312 have impedance inverting characteristics similar to impedance inverter 130 of Doherty amplifier 100.

Impedance matching network 321 and offset line 322 transform the off-state impedance of peak amplifier 320 to a short under low power conditions. This short is then transformed by impedance inverter 330 to a high value at combining node C. Under high power conditions, impedance matching network 321, offset line 322, and impedance inverter 330 convert the impedance seen at combining node C to the desired impedance at the output of peak amplifier 320. An impedance inverter 340 is used to transform the impedance of the load to a different value at combining node C.

The output of the transistor may refer to the intrinsic drain of the transistor. In this case, a phase delay between the intrinsic drain and combining node C may equal 90 degrees for the main amplifier and 180 degrees for the peak amplifier at or near the operational frequency.

Figure 5:
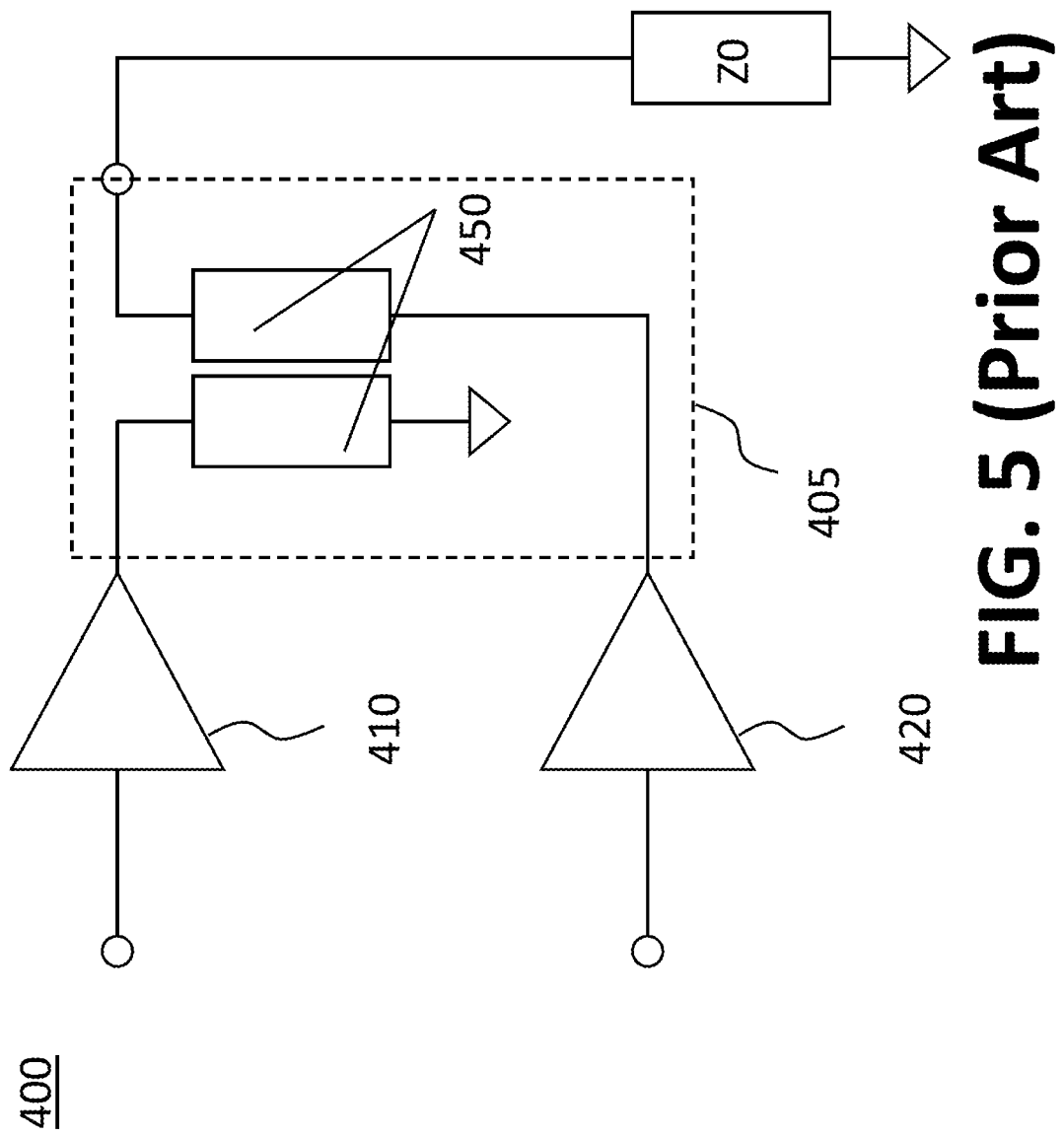
FIG. 5 illustrates a Doherty amplifier.

FIG. 5 shows a Doherty amplifier 400 having an even different configuration. In this case, Doherty combiner 405 includes a pair of coupled lines 450 for combining the signals amplified by main amplifier 410 and peak amplifier 420.

Generally, the Doherty combiner of a Doherty amplifier can be divided in a main branch that extends between the output of the main amplifier and the combining node, and a peak branch that extends between the output of the peak amplifier and the combining node. Generally, the main branch is configured to transform an impedance seen at the output of the Doherty amplifier to a first impedance seen at the output of the main amplifier when the peak amplifier is off, and to transform the impedance seen from the main branch at the output of the Doherty amplifier to a second impedance seen at the output of the main amplifier when the peak and main amplifier are in saturation, wherein the second impedance is lower than the first impedance. Furthermore, the peak branch is generally configured to present a high impedance at the combining node when looking into the peak branch when the peak amplifier is off, and to transform the impedance seen from the peak branch at the output of the Doherty amplifier to a third impedance seen at the output of the peak amplifier when the peak and main amplifier are in saturation. Here, the output of the main and peak amplifier may each refer to the intrinsic drain of the corresponding power transistor.

It is further noted that Doherty amplifiers 200, 300, 400 also include a Doherty splitter, which is omitted in FIGS. 3-5.

Figure 6:
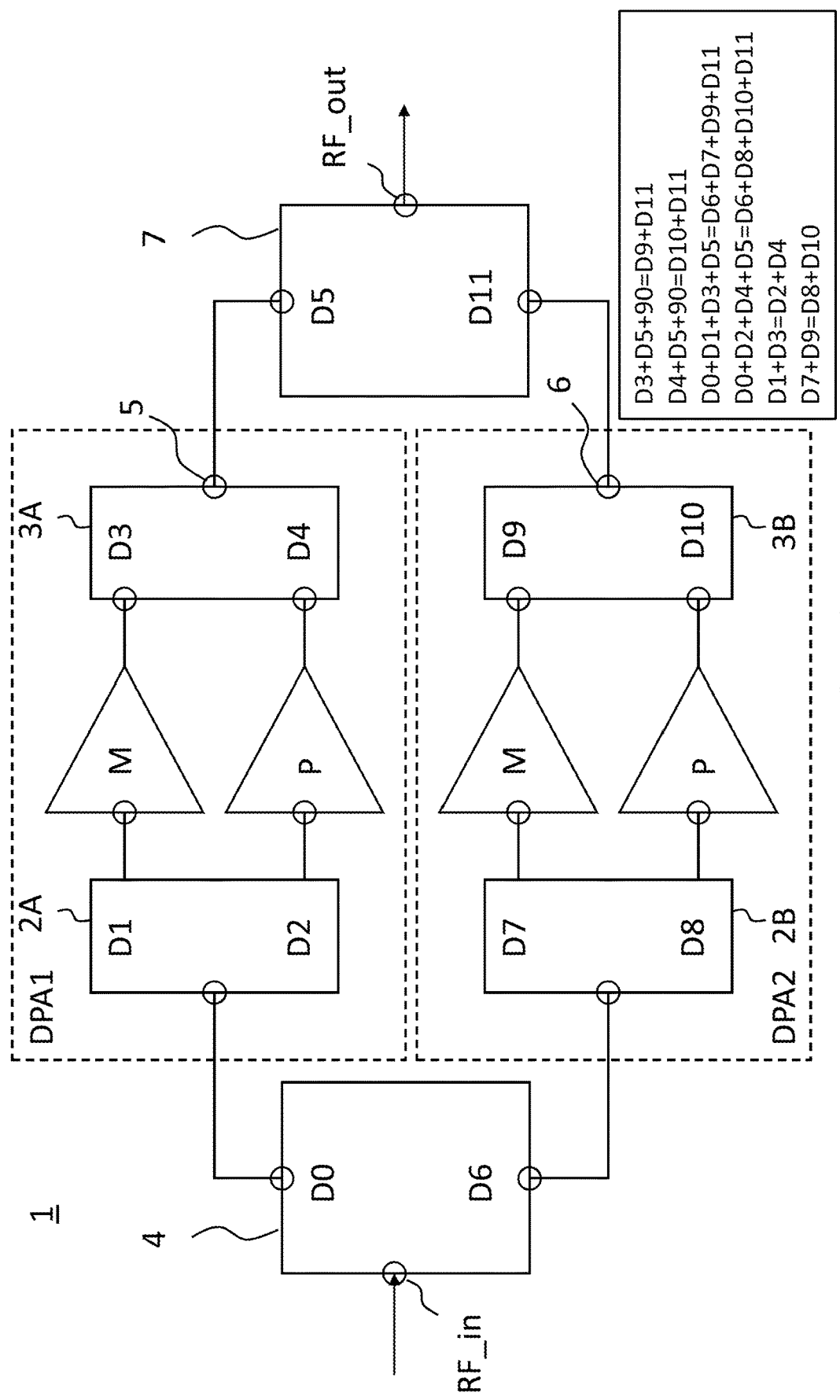
FIG. 6 illustrates an RF amplifier, according to example embodiments.

FIG. 6 illustrates a general embodiment of an RF amplifier 1, according to example embodiments. In FIG. 6, two Doherty amplifiers DPA1, DPA2 are shown that each include a main amplifier M, a peak amplifier P, a Doherty splitter 2A, 2B, and a Doherty combiner 3A, 3B. A splitter 4 is used for splitting an RF signal received at input RF_IN into two RF signal parts that are fed to Doherty splitters 2A, 2B. The outputs 5, 6 of DPA1, DPA2 are connected to a combiner 7 that outputs a combined RF signal at output RF_out of RF amplifier 1.

Inside the various components, a symbol Dx is added, with x=1 . . . 11. This latter symbol indicates a phase delay. For example, D3 indicates the phase delay between one input of Doherty combiner 3A and the output of Doherty combiner 3A. Similarly, D5 indicates a phase delay between one input of combiner 7 and output RF_out.

According to the present disclosure, DPA1 and DPA2 have a different configuration. More in particular, a difference exists between a) the phase delay from the output of main amplifier M of Doherty amplifier DPA1 to output 5 of Doherty amplifier DPA1, and b) the phase delay from the output of the main amplifier M of Doherty amplifier DPA2 to output 6 of Doherty amplifier DPA2. This phase difference equals 90 degrees at or near the operational frequency. It is understood that in practical applications the phase difference may deviate from 90 degrees. However, in some embodiments, the phase difference will lie in a range between 72 and 108 degrees.

Similar considerations hold for the peak branches of DPA1 and DPA2. Moreover, combiner 7 is an in-phase combiner for which D5=D11. In some embodiments, combiner 7 is an isolated in-phase combiner, such as a Wilkinson combiner. The same holds for splitter 4, which can be an in-phase splitter for which D0=D6. Splitter 4 can be an isolated splitter.

In the rectangle of FIG. 6, the various phase relationships are indicated in accordance with the present disclosure.

If amplifier 1 is subjected to impedance mismatch at its output RF_out, the resulting impedance seen at the main amplifiers M of DPA1 and DPA2 will be different due to the different phase delays. Similar considerations hold for the peak amplifiers P. Due to these differences, RF amplifier 1, as a whole, will be less sensitive to load variation. Put differently, the change in power gain, power added efficiency, and/or output will be less for a given load variation.

Figure 7:
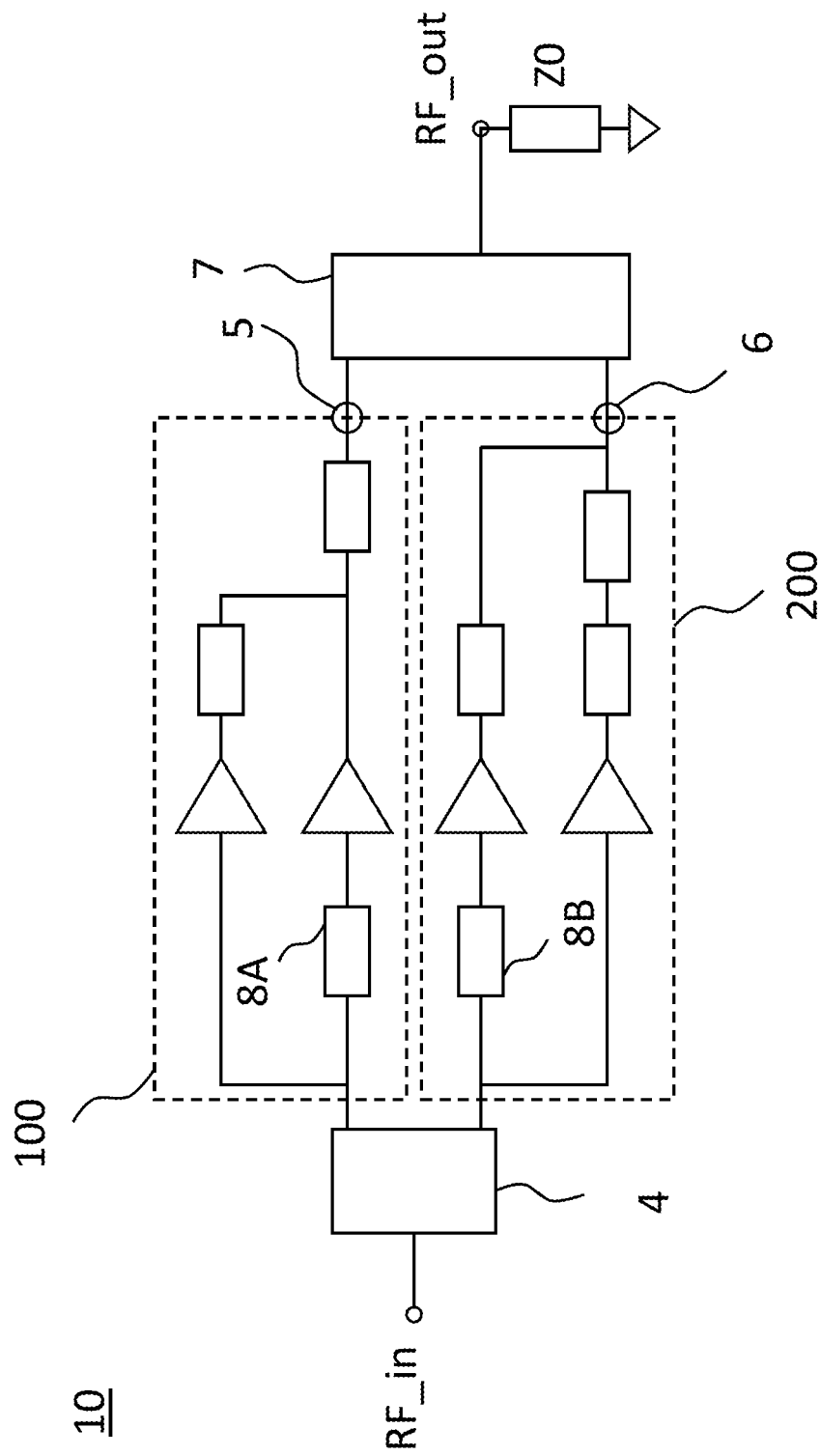
FIG. 7 illustrates a specific implementation of the RF amplifier of FIG. 6, according to example embodiments.

FIG. 7 illustrates a specific implementation of the RF amplifier of FIG. 6. Here, RF amplifier 10 includes a splitter 4 that splits an inputted RF signal into two RF signal parts that are fed to a Doherty amplifier 100 as illustrated in FIG. 1 and a Doherty amplifier 200 as illustrated in FIG. 2. A combiner 7, for example embodied as a Wilkinson combiner, combines the amplified signal from Doherty amplifiers 100, 200, and outputs the RF output signal to load Z0.

In Doherty amplifiers 100, 200, a phase offset element 8A, 8B is implemented to ensure that the signals amplified by the main and peak amplifiers add up in-phase at the outputs of these Doherty amplifiers. Phase offset elements 8A, 8B are part of the Doherty splitters of the Doherty amplifiers 100, 200, which were referred to using reference numerals 2A, 2B in FIG. 6.

As shown in FIG. 7, a phase delay between the output of the main amplifier of Doherty amplifier 100 and the corresponding input of combiner 7 equals 180 degrees, whereas the corresponding phase delay for Doherty amplifier 200 equals 90 degrees. The opposite holds for the phase delays between the outputs of the peak amplifiers and the corresponding inputs of combiner 7.

Figure 8:
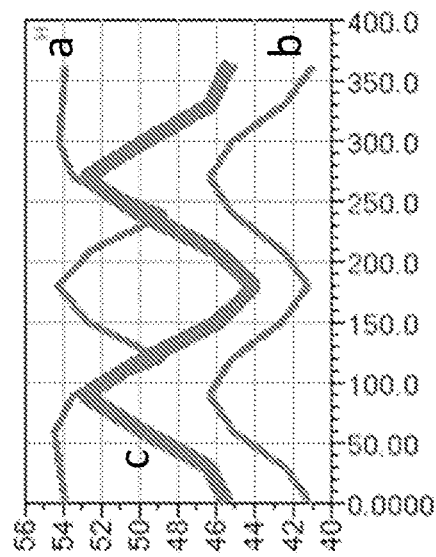
FIG. 8 illustrates a comparison of the performance of the RF amplifier of FIG. 7 to the performance of alternative RF amplifiers in which a hybrid coupler or in-phase combiner are used, according to example embodiments.
Figure 8:
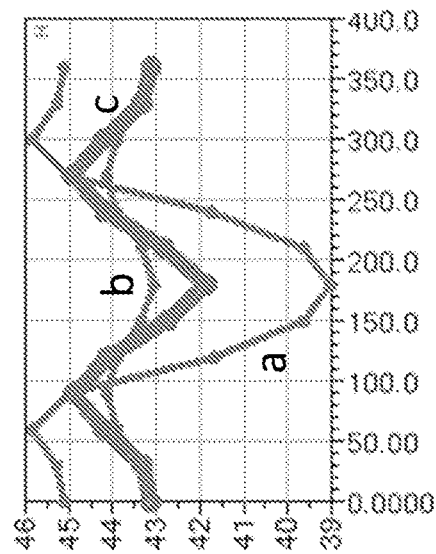
Figure 8:
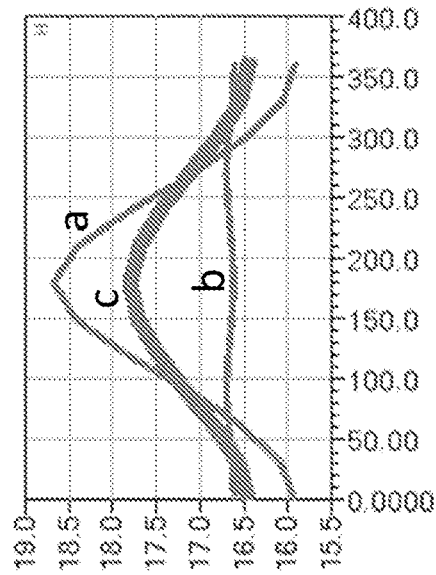

FIG. 8 illustrates a comparison between the RF amplifier of FIG. 7 when the outputs of Doherty amplifiers 100, 200 are directly connected without any explicit combiner, indicated using the letter c, to a known RF amplifier that uses identical Doherty amplifiers and a hybrid coupler, indicated using the letter b, and to a known RF amplifier that uses identical Doherty amplifiers and an in-phase combiner, indicated using the letter a. The maximum output power for the amplifiers when connected to a nominal load of 50 Ohm is identical.

The plot on the left illustrates the gain in dB, the plot in the middle the output power in dBm, and the plot on the right the power added efficiency in percentages. All plots relate to the performance at the 3 dB compression point when the RF amplifiers are provided with a voltage standing wave ratio of 2. The x-axis of the plots corresponds to the phase of the load impedance that is connected.

As shown, the known RF amplifier having the hybrid coupler displays a relatively constant behavior of gain and output power as a function of the phase of the load impedance, but displays reduced power added efficiency. On the other hand, although the known RF amplifier having the in-phase combiner displays a smaller reduction in power added efficiency, it displays a strong variation in gain and output power as a function of the phase of the load impedance. The RF amplifier in accordance with the present disclosure presents behavior that is in between the behavior of the other known RF amplifiers. In other words, the RF amplifier according to the present disclosure displays a smaller reduction in power added efficiency when compared to the known RF amplifier having the hybrid coupler and displays less variation in gain and output power when compared to the known RF amplifier having the in-phase combiner.

It should be noted that the present disclosure equally relates to RF amplifiers in which integrated Doherty amplifiers are used. In these amplifiers, the device or transistor parasitics are used as components of the Doherty combiner. For example, the output capacitance can be used as a shunt capacitor in a C-L-C pi-network that mimics a quarter wavelength transmission line at the operational frequency.

In the above, the present disclosure is described using detailed embodiments thereof. The present disclosure is however not limited to these embodiments. Rather, various modifications to the embodiments are possible without deviating from the scope of the present application, which scope is defined by the attached claims and their equivalents.

What is claimed is:

1. A radiofrequency, RF, amplifier, comprising:
a splitter configured to split an RF input signal received at an input of the RF amplifier into a plurality of RF signal parts;
a plurality of Doherty amplifiers, each Doherty amplifier having a main amplifier and a peak amplifier, wherein each Doherty amplifier is configured to:
amplify a respective RF signal part; and
output a respective amplified RF signal part at an output of the Doherty amplifier; and
a combiner configured to:
combine the amplified RF signal parts from the plurality of Doherty amplifiers into an RF output signal; and
output the RF output signal at an output of the RF amplifier,
wherein the combiner comprises a plurality of inputs and an output,
wherein each input of the combiner is connected to an output of a respective Doherty amplifier among the plurality of Doherty amplifiers,
wherein, for a pair of Doherty amplifiers among the plurality of Doherty amplifiers, a difference between (a) a phase delay from an output of the main amplifier of one Doherty amplifier of the pair of Doherty amplifiers to the output of the one Doherty amplifier and (b) a phase delay from an output of the main amplifier of the other Doherty amplifier of the pair of Doherty amplifiers to the output of the other Doherty amplifier equals $(n+m) \times 180/p + q \times 180$ degrees at an operational frequency,
wherein p is a total number of Doherty amplifiers within the plurality of Doherty amplifiers, n is an integer ranging from 0 to $(p-2)$, q is an integer, and m has a value between 0.8 and 1.2,
wherein the combiner is an in-phase combiner having a plurality of inputs and an output, each input of the combiner being connected to the output of a respective Doherty amplifier,
wherein the phase delays between each of the inputs of the combiner and the output of the combiner are substantially identical, and
wherein the phase delay from the output of the main amplifier of a Doherty amplifier among the plurality of Doherty amplifiers to the output of the Doherty amplifier is different for each Doherty amplifier among the plurality of Doherty amplifiers.

2. A radiofrequency, RF, amplifier, comprising:
a splitter configured to split an RF input signal received at an input of the RF amplifier into a plurality of RF signal parts;
a plurality of Doherty amplifiers, each Doherty amplifier having a main amplifier and a peak amplifier, wherein each Doherty amplifier is configured to:
amplify a respective RF signal part; and
output a respective amplified RF signal part at an output of the Doherty amplifier; and
a combiner configured to:
combine the amplified RF signal parts from the plurality of Doherty amplifiers into an RF output signal; and
output the RF output signal at an output of the RF amplifier,
wherein the combiner comprises a plurality of inputs and an output,
wherein each input of the combiner is connected to an output of a respective Doherty amplifier among the plurality of Doherty amplifiers,
wherein, for a pair of Doherty amplifiers among the plurality of Doherty amplifiers, a difference between (a) a phase delay from an output of the main amplifier of one Doherty amplifier of the pair of Doherty amplifiers to the output of the one Doherty amplifier and (b) a phase delay from an output of the main amplifier of the other Doherty amplifier of the pair of Doherty amplifiers to the output of the other Doherty amplifier equals $(n+m) \times 180/p + q \times 180$ degrees at an operational frequency,
wherein p is a total number of Doherty amplifiers within the plurality of Doherty amplifiers, n is an integer ranging from 0 to $(p-2)$, q is an integer, and m has a value between 0.8 and 1.2,
wherein each Doherty amplifier among the plurality of Doherty amplifiers comprises:
a Doherty splitter configured to split the received RF input signal into a main RF signal part and a peak RF signal part,
wherein the main amplifier is configured to:
amplify the main RF signal part; and
output an amplified main RF signal part, and
wherein the peak amplifier is configured to:
amplify the peak RF signal part; and
output an amplified peak RF signal part; and
a Doherty combiner configured to:
combine the amplified main RF signal part and the amplified peak RF signal part into a respective amplified RF signal part; and
output the respective amplified RF signal part at the output of the Doherty amplifier,
wherein the Doherty combiner of each of the plurality of Doherty amplifiers is configured to combine the amplified main RF signal part and the amplifier peak RF signal part at a combining node of that Doherty amplifier,
wherein:
the combining node is directly connected to or forms the output of that Doherty amplifier; or
the combining node is connected to the output of that Doherty amplifier through a first impedance inverter
wherein the Doherty amplifier of each of the plurality of Doherty amplifiers comprises:
a main branch extending between the output of the main amplifier and the combining node; and
a peak branch extending between the output of the peak amplifier and the combining node,
wherein the main branch is configured to:

transform an impedance seen at the output of the Doherty amplifier to a first impedance seen at the output of the main amplifier when the peak amplifier is off; and transform the impedance seen from the main branch at the output of the Doherty amplifier to a second impedance seen at the output of the main amplifier when the peak and the main amplifier are in saturation, wherein the second impedance is lower than the first impedance, wherein the peak branch is configured to:
present a high impedance at the combining node when looking into the peak branch when the peak amplifier is off; and transform the impedance seen from the peak branch at the output of the Doherty amplifier to a third impedance seen at the output of the peak amplifier when the peak and the main amplifier are in saturation, and wherein at least one of the main branch and the peak branch comprises a second impedance inverter for each Doherty amplifier among the plurality of Doherty amplifiers.

3. The RF amplifier according to claim 1, wherein the phase difference equals $(n+m)\times 180/p+q\times 180$ degrees at the operational frequency for each pair of Doherty amplifiers among the plurality of Doherty amplifiers.

4. The RF amplifier according to claim 1, wherein each Doherty amplifier among the plurality of Doherty amplifiers comprises:
a Doherty splitter configured to split the received RF input signal into a main RF signal part and a peak RF signal part,
wherein the main amplifier is configured to:
amplify the main RF signal part; and
output an amplified main RF signal part, and
wherein the peak amplifier is configured to:
amplify the peak RF signal part; and
output an amplified peak RF signal part; and
a Doherty combiner configured to:
combine the amplified main RF signal part and the amplified peak RF signal part into a respective amplified RF signal part; and
output the respective amplified RF signal part at the output of the Doherty amplifier.

5. The RF amplifier according to claim 4,
wherein the Doherty combiner of each of the plurality of Doherty amplifiers is configured to combine the amplified main RF signal part and the amplifier peak RF signal part at a combining node of that Doherty amplifier, and
wherein:
the combining node is directly connected to or forms the output of that Doherty amplifier; or
the combining node is connected to the output of that Doherty amplifier through a first impedance inverter.

6. The RF amplifier according to claim 5, wherein the first impedance inverter of at least one Doherty amplifier among the plurality of Doherty amplifiers is formed by:
a first quarter wavelength transmission line; or
an electrical equivalent of the first quarter wavelength transmission line.

7. The RF amplifier according to claim 5,
wherein the Doherty amplifier of each of the plurality of Doherty amplifiers comprises:
a main branch extending between the output of the main amplifier and the combining node; and
a peak branch extending between the output of the peak amplifier and the combining node,
wherein the main branch is configured to:
transform an impedance seen at the output of the Doherty amplifier to a first impedance seen at the output of the main amplifier when the peak amplifier is off; and
transform the impedance seen from the main branch at the output of the Doherty amplifier to a second impedance seen at the output of the main amplifier when the peak and the main amplifier are in saturation,
wherein the second impedance is lower than the first impedance, and
wherein the peak branch is configured to:
present a high impedance at the combining node when looking into the peak branch when the peak amplifier is off; and
transform the impedance seen from the peak branch at the output of the Doherty amplifier to a third impedance seen at the output of the peak amplifier when the peak and the main amplifier are in saturation.

8. The RF amplifier according to claim 7, wherein at least one of the main branch and the peak branch comprises a second impedance inverter for each Doherty amplifier among the plurality of Doherty amplifiers.

9. The RF amplifier according to claim 8, wherein the second impedance inverter(s) is/are formed by:
a second quarter wavelength transmission line; or
an electrical equivalent of the second quarter wavelength transmission line.

10. The RF amplifier according to claim 1, wherein the combiner is an isolated combiner.

11. The RF amplifier according to claim 1, wherein each Doherty amplifier of the plurality of Doherty amplifiers has a configuration similar to one of a regular Doherty amplifier configuration, an inverted Doherty amplifier configuration, a parallel Doherty amplifier configuration, an integrated Doherty amplifier configuration, a Doherty amplifier configuration having a transformed-based Doherty combiner, or a Doherty amplifier configuration having a coupled lines-based Doherty combiner.

12. The RF amplifier according to claim 11, wherein the configuration of at least two Doherty amplifiers among the plurality of Doherty amplifiers is different.

13. The RF amplifier according to claim 1, wherein the splitter comprises:
an input for receiving the input RF signal from the input of the RF amplifier;
a plurality of outputs for outputting the plurality of RF signal parts corresponding to the plurality of Doherty amplifiers; and
one or more phase delay elements for imparting a phase delay to one or more of the plurality of RF signal parts to cause the amplified RF signal parts to add up in-phase at the output of the RF amplifier.

14. The RF amplifier according to claim 1, further comprising a substrate, wherein the main amplifier and the peak amplifier each comprises a semiconductor die, arranged on the substrate, on which a power transistor is integrated.

15. The RF amplifier according to claim 14, wherein the semiconductor die of the main amplifier and the peak amplifier are packaged, and wherein the package of the main amplifier and the package of the peak amplifier are mounted on the substrate.

16. The RF amplifier according to claim 1, wherein p=3 or p=4.

17. An electronic device comprising the RF amplifier according to claim 1.

18. The electronic device according to claim 17, wherein the electronic device is a base station for mobile telecommunications or a solid-state cooking apparatus.

19. A radiofrequency, RF, amplifier, comprising:
a splitter configured to split an RF input signal received at an input of the RF amplifier into a plurality of RF signal parts;
a plurality of Doherty amplifiers, each Doherty amplifier having a main amplifier and a peak amplifier, wherein each Doherty amplifier is configured to:
  amplify a respective RF signal part; and
  output a respective amplified RF signal part at an output of the Doherty amplifier; and
a combiner configured to:
  combine the amplified RF signal parts from the plurality of Doherty amplifiers into an RF output signal; and
  output the RF output signal at an output of the RF amplifier,
wherein the combiner comprises a plurality of inputs and an output,
wherein each input of the combiner is connected to an output of a respective Doherty amplifier among the plurality of Doherty amplifiers,
wherein, for a pair of Doherty amplifiers among the plurality of Doherty amplifiers, a difference between (a) a phase delay from an output of the main amplifier of one Doherty amplifier of the pair of Doherty amplifiers to the output of the one Doherty amplifier and (b) a phase delay from an output of the main amplifier of the other Doherty amplifier of the pair of Doherty amplifiers to the output of the other Doherty amplifier equals $(n+m) \times 180/p + q \times 180$ degrees at an operational frequency,
wherein p is a total number of Doherty amplifiers within the plurality of Doherty amplifiers, n is an integer ranging from 0 to $(p-2)$, q is an integer, and m has a value between 0.8 and 1.2, and
wherein the phase delay from the output of the main amplifier of a Doherty amplifier among the plurality of Doherty amplifiers to the output of the Doherty amplifier is different for each Doherty amplifier among the plurality of Doherty amplifiers.

20. The RF amplifier according to claim 10, wherein the isolated combiner is a Wilkinson combiner.

* * * * *